United States Patent [19]

Itoh et al.

[11] Patent Number: 5,430,397
[45] Date of Patent: Jul. 4, 1995

[54] INTRA-LSI CLOCK DISTRIBUTION CIRCUIT

[75] Inventors: Hiroyuki Itoh, Akigawa; Noboru Masuda, Tokorozawa; Hideo Maejima, Hitachi; Tadahiko Nishimukai, Sagamihara, all of Japan

[73] Assignee: Hitachi, Ltd., Tokyo, Japan

[21] Appl. No.: 186,544

[22] Filed: Jan. 26, 1994

[30] Foreign Application Priority Data

Jan. 27, 1993 [JP] Japan .................. 5-011371

[51] Int. Cl.6 .................. H03K 19/00; H03K 5/00
[52] U.S. Cl. ..................... 326/101; 327/297; 327/295
[58] Field of Search .............. 326/93, 90, 86, 101; 327/297, 295

[56] References Cited

U.S. PATENT DOCUMENTS

| | | | |
|---|---|---|---|
| 5,013,942 | 5/1991 | Nishimura et al. | 327/295 |
| 5,043,596 | 8/1991 | Masuda et al. | 327/295 |
| 5,140,184 | 8/1992 | Hamamoto et al. | 327/295 |
| 5,172,330 | 12/1992 | Watanabe et al. | 327/295 |
| 5,184,027 | 2/1993 | Masuda et al. | 327/295 |
| 5,239,215 | 8/1993 | Yamaguchi | 327/295 |
| 5,264,746 | 11/1993 | Ohmae et al. | 327/295 |
| 5,270,592 | 12/1993 | Takahashi et al. | 327/295 |

FOREIGN PATENT DOCUMENTS

| | | |
|---|---|---|
| 63-293620 | 11/1988 | Japan . |
| 2-105910 | 4/1990 | Japan . |
| 3-101412 | 4/1991 | Japan . |
| 3-161815 | 7/1991 | Japan . |
| 4-76610 | 3/1992 | Japan . |

OTHER PUBLICATIONS

1992 Symposium on VLSI Circuits Digest of Technical Pages, "Clocking Strategies In Hig Performance Processors", pp. 50-53, Feb. 1992, Horowitz.
ISSCC 92 Session 6/Microprocessors/Paper TA 6.1, Jun. 1992, IEEE International Solid-State Circuits Conference, "A 100 MHZ Macropipelined CISC Microprocessor", Badeau et al., pp. 104-105.
ISSCC 92 Session 6/Microprocessors/Paper TA 6.1, Jun. 1992, IEEE International Solid-State Circuits Conference, "A 200 mhz 64b Dual-Issue CMOS Microprocessor", Dobberpuhl et al., pp. 106-107.
ISSCC 92 Session 6/Microproessors/Paper TA 6.1, Jun. 1992, IEEE International Solid-State Circuits Conference, "A Three-Million Transistor Microprocessor", Abu-Nofal et al., pp. 108-109.

*Primary Examiner*—David R. Hudspeth
*Assistant Examiner*—Richard Roseen
*Attorney, Agent, or Firm*—Antonelli, Terry, Stout & Kraus

[57] ABSTRACT

An intra-LSI clock distribution circuit which includes a main distribution circuit, a plurality of intra-block clock distribution circuitries, feedback wires provided in association with each of blocks and each connected to one of plural block-based clock signal wires within the associated block and the intra-block distribution circuitry of the associated block for feeding back the intra-block clock signal distributed to a given one of circuit elements connected to the intra-block clock signal wires to the intra-block clock distribution circuitry of that block. The intra-block clock distribution circuitry in each of the blocks responds to the block-destined clock signal supplied to the associated block via one of the block-based clock signal wires connected thereto and the intra-block clock signals fed back via the feedback wires in the associated block to thereby generate a plurality of intra-block clock signals having respective phases which depend on differences in phase between the block-destined clock signal and the fed-back intra-block clock signals.

26 Claims, 8 Drawing Sheets

INTRA-LSI CLOCK DISTRIBUTION CIRCUIT

BACKGROUND OF THE INVENTION

The present invention relates to a clock distribution circuit for supplying a clock signal to a plurality of parts or circuitries incorporated in a large scale integrated circuit or LSI chip.

In conjunction with supply of clock signals to a number of circuitries incorporated in a LSI chip used in electronic computers and the like, there have heretofore been proposed a variety of approaches for making it possible to supply the clock signals to a number of internal circuitries while maintaining same phase among the clock signals. As a typical one of such approaches, there may be mentioned a technique disclosed in, for example, "1992 Symposium on VLSI Circuits Digest of Technical Papers", pp. 50–53, and ISSCC 92 SESSION 6/MICROPROCESSORS/PAPER TA6.2, PAPER TA6.3 and PAPER TA6.1. A clock signal supply system is disclosed in, for example, U.S. Pat. No. 5,184,027 issued on Feb. 2, 1993.

As the most popular intra-LSI clock distribution circuit, a distribution circuit of tree-like structure may be mentioned, which is comprised of a main distribution circuit disposed at an appropriate position within the LSI chip, e.g. at a center thereof, and a plurality of intra-block distribution circuitries disposed within a plurality of regions or blocks of a same size which result from division of the chip. The main distribution circuit receives a clock signal supplied externally of the chip and distributes the clock signal to a plurality of intra-block distribution circuitries via a plurality of wires having respective capacitances equal to one another. Each of the intra-block distribution circuitries in turn distributes again the received clock signal to a plurality of flip-flops, respectively, which are incorporated in the associated block via a plurality of wires having substantially same capacitance. In an LSI chip where a large number of flip-flops are provided in each block, a plurality of drivers are connected to the output of the intra-block clock distribution circuitries in a tree-like configuration, wherein the clock signal is supplied to associated one or plural flip-flops from the drivers of the final stage.

The intra-block distribution circuitry or the clock driver is implemented in a same structure common to all the blocks. By virtue of this arrangement, the delays which the clock signals experience in the course of traveling along the wires from the intra-block distribution circuitry to the individual flip-flops provided in each block can be equalized to one another, whereby clock skew is suppressed.

As another typical clock distribution circuit, there may be mentioned a net-like distribution circuit, which is comprised of wires provided over the whole chip in a mesh-like pattern and a group of drivers for supplying the clock signal to the wires, wherein the drivers are connected in a tree-like array having a multiplicity of stages, and the outputs of plural drivers belonging to a same stage are connected to one another, as is shown in FIG. 1 of the reference literature cited above. By decreasing sufficiently the resistance of the mesh-like wiring, difference in the timing of voltage changes brought about at various circuit points in the mesh by the clock signal can be suppressed to a negligible minimum. Thus, the flip-flops in the LSI to which the clock signal is to be supplied can be connected to the mesh at the appropriate positions located in the vicinity of the flip-flops.

Parenthetically, an inter-chip block distribution circuit for distributing clocks to a plurality of chips is also described in the aforementioned literature as well.

As another technique known heretofore, there may be mentioned one disclosed in JP-A-4-76610 filed in the name of the assignee of this application, according to which clocks are supplied in parallel to a plurality of blocks in an LSI chip, wherein a clock signal supplied to a representative one of the blocks is selected for phase-matching with the clock signals supplied to the blocks located in the periphery of the representative block. Besides, the clock signals for the peripheral blocks can also be utilized for the phase-matching of the clock signals supplied to the blocks located around the peripheral blocks.

In the clock distribution circuit of the tree configuration, it is necessary to equalize mutually the load capacitances of plural wires leading to the flip-flops from the clock distribution circuitry so that the delays which the clock signals undergo during traveling from the intra-block distribution circuitry to the plural flip-flops can be equalized. To this end, the wires are formed of a same material and so designed as to have respective lengths equal to one another.

In practical applications, however, very complicated design and troublesome manufacturing process are required in order to cancel out variance in the delay time among the clock signals. It is naturally expected that the problem becomes more serious as the scale of LSI increases further in the future.

By way of example, in the case of an LSI known as the gate array, a large number of elements having a same structure and referred to as the basic cells are incorporated, wherein interconnections of the cells can be changed in dependence on applications which the LSI chip can find. Thus, the LSI capable of performing various functions can be implemented by using one and the same LSI chip. In the case of this gate array, a great number of basic cells mentioned above are periodically disposed and divided into a plurality of blocks of a same size independent of intended applications of the LSI, wherein the intra-block clock distribution circuitry is previously included in each of the blocks. Thus, in the LSI of this type, the blocks have respective sizes which are equal to one another.

However, even with the LSI of the structure mentioned above, it is expected that attempt for equalization of clock delay times among the blocks will encounter difficulty which becomes more serious in the not far distant future.

More specifically, the delay times involved in the clock transfers from the intra-block distribution circuitry to the individual flip-flops depend on the driving capability of the distribution circuitry and capacitances of the interconnecting wires. Besides, in the case where the clock drivers are interposed between the distribution circuitry and the flip-flops, the delay depends on the driving capability of the drivers as well.

When the size of the LSI chip increases in the future, variance in the delay in the clock transfer will become more remarkable in dependence on the locations of the intra-block clock distribution circuitries, the drivers and the wires in the LSI even for the same driving capabilities of the distribution circuits and the drivers as well as the same width and thickness of the wires. Among others, variance in the driving capabilities of the intra-block distribution circuitries and the drivers will play important roles in bringing about variance in the delay involved in the clock transfer, which may also result in that the delay in clock transfer differs from one to another block.

Besides, when the integrated density of the LSI increases, the same problem as elucidated above will arise for other reasons.

In an LSI chip of high integration density, there exist many other wires than those for the clock signal, wherein the former are formed in the vicinity of or in superposition to the clock transfer wires. As a result of this, stray capacitances between the clock wires and the other wires can no more be neglected. Such stray capacitances assume different values in dependence on the positions assumed by the individual wires within the LSI chip. As a consequence, the clock transfer time becomes different in dependence on the positions of the clock wires within the LSI chip even when the length and the thickness are designed to be same among the clock signal wires. Ultimately, the clock signal transfer time will differ from one to another block.

The influence of clock skew among the blocks due to the various causes or factors mentioned above will become more adverse as the period of the clock signal is further shortened or clock frequency further increases in the future.

Besides, the known techniques suffer from additional problem that great difficulty is encountered in designing the clock transfer wires in the LSI chip where the blocks have different sizes.

By way of example, there is such an LSI chip in which a variety of circuitries having different functions are included. Let's suppose, for example, an LSI chip which includes memory circuitries and various logic circuitries. In this type LSI, it is desirable from the standpoint of circuit design to make the sizes of the blocks serving as the units for supplying clocks differ in dependence on the sizes (extents) of the circuitries mentioned above. Nevertheless, according to the prior art techniques, the clock transfer wires are so designed that the lengths of the wires extending from the intra-block clock distribution circuitries to the flip-flops in the individual blocks are equal to one another even in the case of the LSI chip where the blocks have different sizes.

However, in view of easiness of design, it is desirable that the clock transfer wires having lengths differing on a block-by-block basis can be used so far as the block size differs from one to another block.

At this juncture, it should be mentioned that the influence of variance in the driving capability among the drivers can be mitigated in the case of the prior art LSI in which the mesh-like clock wiring is adopted, as described hereinbefore, because the outputs of the clock drivers arrayed in a multiplicity of stages are mutually connected. Besides, because the clock transfer wires of net-like pattern are provided over the whole chip, accurate control or adjustment of the wire length is not necessarily required.

However, because the clock transfer wiring is of mesh-like pattern, the overall length of the wire is much longer than that of the wire used in the tree-like wiring pattern. For this reason, the prior art technique mentioned above suffers a problem of large power consumption due to the wire. It goes without saying that the power consumption will further increase as the scale of the LSI becomes larger.

When compared with the prior art techniques mentioned above, it is expected that the approach disclosed in JP-A-4-76610 can ensure more effective reduction of the clock skew in the LSI. However, in reality, it is doubtful that the effect is to be satisfactory. More specifically, according to the approach as proposed, phase comparisons within the blocks and between the adjacent blocks are performed sequentially to thereby realize the phase matching of the clock for the whole chip. Consequently, errors in the sequential phase matchings will be accumulated, to thereby prevent the effect as intended from being attained.

SUMMARY OF THE INVENTION

In the light of the state of the art described above, it is a first object of the present invention to provide a clock distribution circuit for an LSI chip or device which can make available the clock signals of least skew in the whole LSI chip even when load capacitances of clock signal wires implemented in the LSI differ from one another.

A second object of the present invention is to provide a clock distribution circuit for an LSI chip or device which can make available clock signals of least skew in the whole LSI while allowing the lengths of the intra-LSI clock signal wires to be changed or varied in dependence on locations within the LSI.

A third object of the present invention is to provide a clock distribution circuit for an LSI chip or device which can supply clock signals of least skew for the whole LSI through simple control of the clock signal wire length and with lower power consumption when compared with an LSI where the net-like clock signal wiring is employed, even when the load capacitances of the intra-LSI clock signal wires change in dependence on locations within the LSI.

In view of the first object mentioned above, there is provided according to a first aspect of the invention an intra-LSI clock distribution circuit which includes a main distribution circuit, a plurality of intra-block clock distribution circuitries, feedback wires provided in association with each of blocks and each connected to one of plural block-based clock signal wires within the associated block and the intra-block distribution circuitry of the associated block for feeding back the intra-block clock signal distributed to a given one of circuit elements connected to the intra-block clock signal wires to the intra-block clock distribution circuitry of that block, wherein the intra-block clock distribution circuitry in each of the blocks responds to the block-destined clock signal supplied to the associated block via one of the block-based clock signal wires connected thereto and the intra-block clock signals fed back via the feedback wires in the associated block to thereby generate a plurality of intra-block clock signals having respective phases which depend on differences in phase between the block-destined clock signal and the fed-back intra-block clock signals, respectively.

For achieving the second object mentioned above, there is provided according to a second aspect of the invention an intra-LSI clock distribution circuit which includes a main distribution circuit, a plurality of intra-block clock distribution circuitries, feedback wires provided in association with each of blocks and each connected to one of plural block-based clock signal wires within the associated block and the intra-block distribution circuitry thereof for feeding back the intra-block clock signal distributed to a given one of circuit elements connected to the intra-block clock signal wires to the intra-block clock distribution circuitry of that block. The intra-block clock signals supplied to a plurality of circuit elements in each block via the plurality of intra-block clock signal wires in each block have phases which differ substantially from the phases of plural intra-block clock signals supplied to a plurality of circuit elements in at least one of the other blocks via the plural intra-block signal wires. The intra-block clock distribution circuitry in each of the blocks responds to the block-destined clock signal supplied to the associated block via one of the block-based clock signal wires connected to the associated block and the intra-block clock signals fed back via the feedback wires in the associated block to thereby generate a plurality of intra-block clock signals having respective phases which depend on differences in phase between the block-destined clock signal and the fed-back intra-block clock signals, respectively.

Further, in view of the third object mentioned above, there is provided according to a third aspect of the invention an intra-LSI distribution circuit which includes a main distribution circuit, a plurality of intra-block distribution circuitries, and a plurality of intra-block clock signal wires interconnected so as to form a net-like wiring, and a plurality of circuit elements connected to a net-like wiring formed in the block. Further, a plurality of feedback wires are provided in association with each of the blocks and each connected to the net-like wiring formed in the associated block and the intra-block clock distribution circuitry for feeding back the intra-block clock signal distributed to a given one of the circuit elements to the intra-block clock distribution circuitry. The intra-block clock distribution circuitry in each of the blocks responds to the block-destined clock signal supplied to the block via one of the block-based clock signal wires connected to the block and the intra-block clock signals fed back via the feedback wire to thereby generate a plurality of intra-block clock signals having respective phases which depend on differences in phase between the block-destined clock signal and the fed-back intra-block clock signals, respectively.

The above other objects, features and attendant advantages of the present invention will more clearly be understood by reading the following description of the preferred embodiments thereof taken, only by way of example, by reference to the drawings.

DESCRIPTION OF THE PREFERRED EMBODIMENTS

Now, the present invention will be described in detail in conjunction with preferred or exemplary embodiments thereof by reference to the drawings.

Embodiment 1

Figure 1:
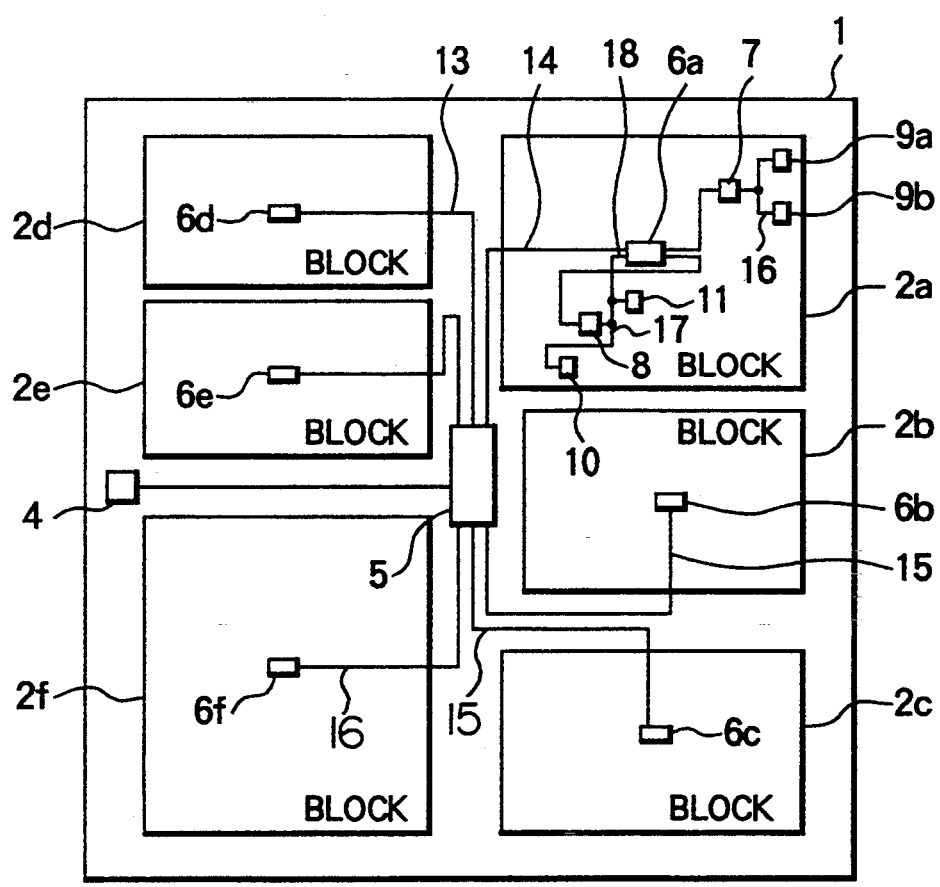
FIG. 1 is a schematic circuit diagram showing generally a configuration of an intra-LSI clock distribution circuit according to a first embodiment of the present invention.

FIG. 1 is a schematic circuit diagram showing generally a configuration of an intra-LSI clock distribution circuit according to a first embodiment of the invention. As can be seen from the figure, an LSI chip 1 is divided into a plurality of blocks $2a$, $2b$, . . . , $2f$. These blocks may constitute a set of logic gates or memory cell arrays. However, concrete function for which these blocks are to serve are less important for the invention. In the case of the instant embodiment, it is assumed that the individual blocks have sizes which differ from one to another. What is indispensably required is that clock signals are precisely in phase with one another at the time point when the clock signals are inputted to flip-flops $9a$, $9b$, 10, 11, etc. which belong to the blocks of different sizes provided in the LSI chip 1.

The clock signal is supplied to the LSI chip 1 via a pad 4 which is not necessarily required to be disposed at a peripheral location of the LSI chip as shown in FIG. 1. The clock signal applied to the pad 4 is first sent to an inter-block distribution circuit 5. This circuit 5 should be disposed substantially at a center of the LSI chip 1, because it then becomes easy to establish at least approximately equal distances between the inter-block clock distribution circuit 5 and individual blocks $2a$, etc. and because it is easy to equalize the delay times of the clock signals supplied to the blocks to thereby make these signals in phase with one another, which will hereinafter be described in more detail. Of course, when the delay times are equalized by adjusting not only the wiring lengths for the clock signals but also the circuit currents, it is not always necessary to position the main distribution circuit 5 at the center of the LSI chip 1. However, in view of the fact that matching of the delay times by correspondingly selecting the wiring lengths is easier to realize than the last mentioned measures, i.e., adjustment of the wiring length and currents, the main distribution circuit 5 should preferably be disposed at the center position of the LSI chip, as shown in FIG. 1.

There are provided wires 13, 14, 15, 16 and so forth which extend from the main distribution circuit 5 to intra-block distribution circuitries $6a$, $6b$, $6c$, . . . , $6f$, etc. for distributing the clock signal inputted via the pad 4 to these circuits $6a$, etc. According to the teachings of the invention incarnated in the instant embodiment, the wires 13, 14, 15, 16 and so forth are so designed that the wiring capacitances and resistances of these wires are equal to one another with a view to make equal the delay times of the clock signals fed via the wires 13, 14, 15, etc. At this juncture, it should be mentioned that the circuit currents with which the main distribution circuit 5 drives the wires 13, 14, 15, etc. are designed to be equal to one another. Accordingly, the delay times involved during the travel of the clock signal to the intra-block distribution circuitries $6a$, etc. can be made equal to one another substantially by making equal the wiring capacitances and resistances of the wires 13, 14, 15, etc. One of the simplest methods of substantially equalizing the wiring capacitances and the wiring resistances of the wires 13, 14, 15, etc. is to make equal the wiring lengths thereof. Accordingly, in practical applications, a same wiring material and a same manufacturing process should preferably be employed for forming the wires of a same length with a constant width, whereon the wiring lengths are subsequently finely adjusted by taking into account minute variance in the wiring capacitance due to intersection of the wires.

Parenthetically, it should be mentioned that because the main distribution circuit 5 for driving the wires mentioned above are disposed concentratively at a given location within the LSI chip, variance in the driving capability of the circuits for driving the wires 13, 14, 15, etc. can be neglected even in the case of a LSI chip of a large size.

Figure 2:
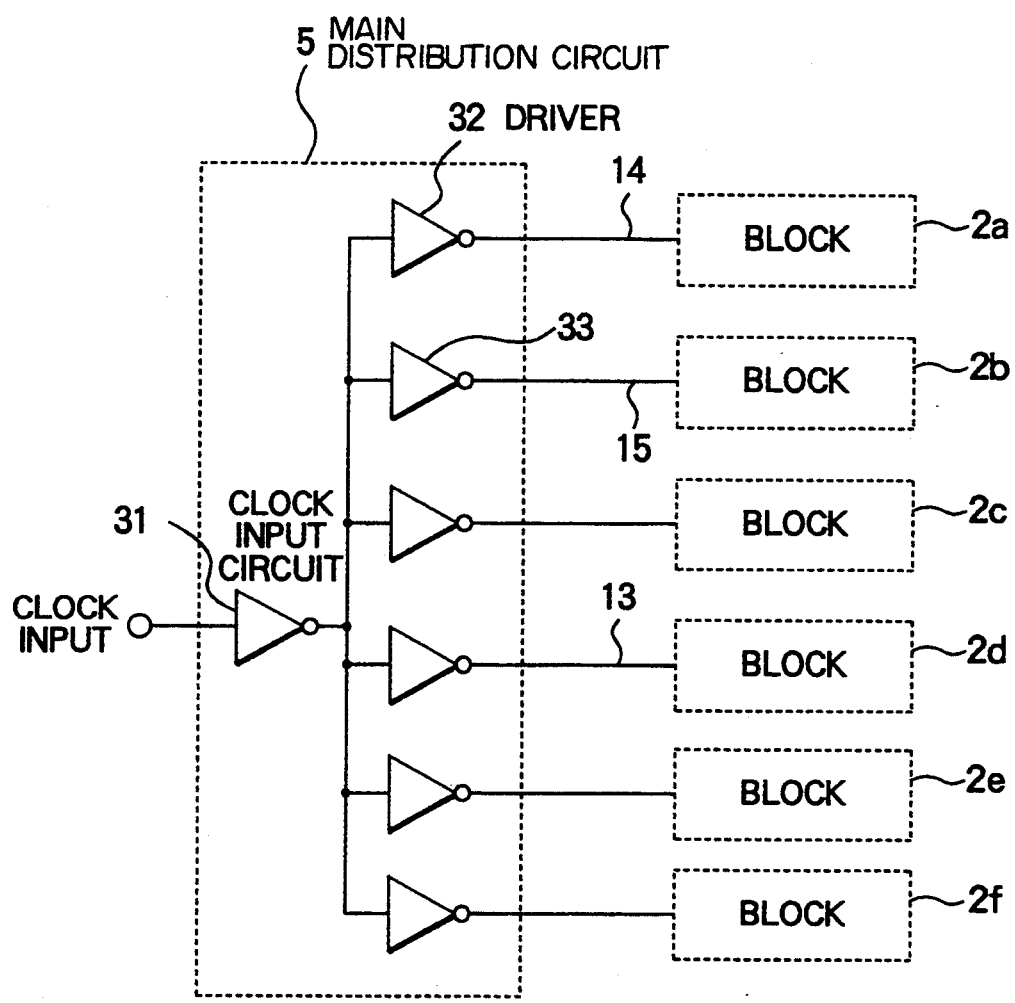
FIG. 2 is a circuit diagram showing schematically a circuit configuration of a main distribution circuit (5) employed in the device shown in FIG. 1.

FIG. 2 shows schematically a circuit configuration of the main distribution circuit 5. The distribution circuit 5 is equipped with a number of outputs in order to supply the clock signal to the individual blocks 2a, 2b, . . . , 2f, wherein a corresponding number of clock drivers 32, 33, etc. are connected to a clock input circuit 31. The output wires 14, 15, 16, etc. of the clock drivers 32, 33, 34, etc. lead to the blocks 2a, 2b, 2c, etc., respectively. Although the output wires 14 and others are led out from the mutually different clock drivers 32, etc., the output wires 14, etc. scarcely exert any adverse influence to power consumption and other characteristic of the device even when the outlets of the clock drivers are connected to each other, because the distribution circuits 5 are disposed concentratively at a specific location on the LSI chip. Alternatively, the clock drivers 32, 33 and others may be implemented by a single large-size driver substantially to the same effect.

Disposed in each of the blocks 2a, 2b, . . . , 2f are intra-block clock distribution circuitries 6a, 6b, . . . , 6f, respectively, each of which serves for distributing the clock signal internally of the associated block. The intra-block distribution circuitries 6a, 6b, . . . , 6f are positioned substantially at centers within the associated blocks 2a, 2b, . . . , 2f, respectively, for the same reason described previously in conjunction with the inter-block clock distribution circuit 5, i.e., because of easiness in equalizing the distances to the flip-flops disposed within each associated block. In the case where the block constitutes a memory cell array, it is not preferred to dispose the intra-block distribution circuitry at the center of the block. In this case, the intra-block distribution circuitry should preferably be positioned substantially at the center in a group of circuits which require the clock signal for the operation thereof.

Thus, it is possible by adopting the methods mentioned above to realize matching among the delay times which the signals undergo before reaching the respective inlet ports of the individual blocks. Further, in view of the fact that the number of the blocks and hence that of the wires leading to the blocks are in the range of 10 to 20 at the most, it is easy to equalize the delay times for the individual wires by carefully designing the layout.

Figure 3:
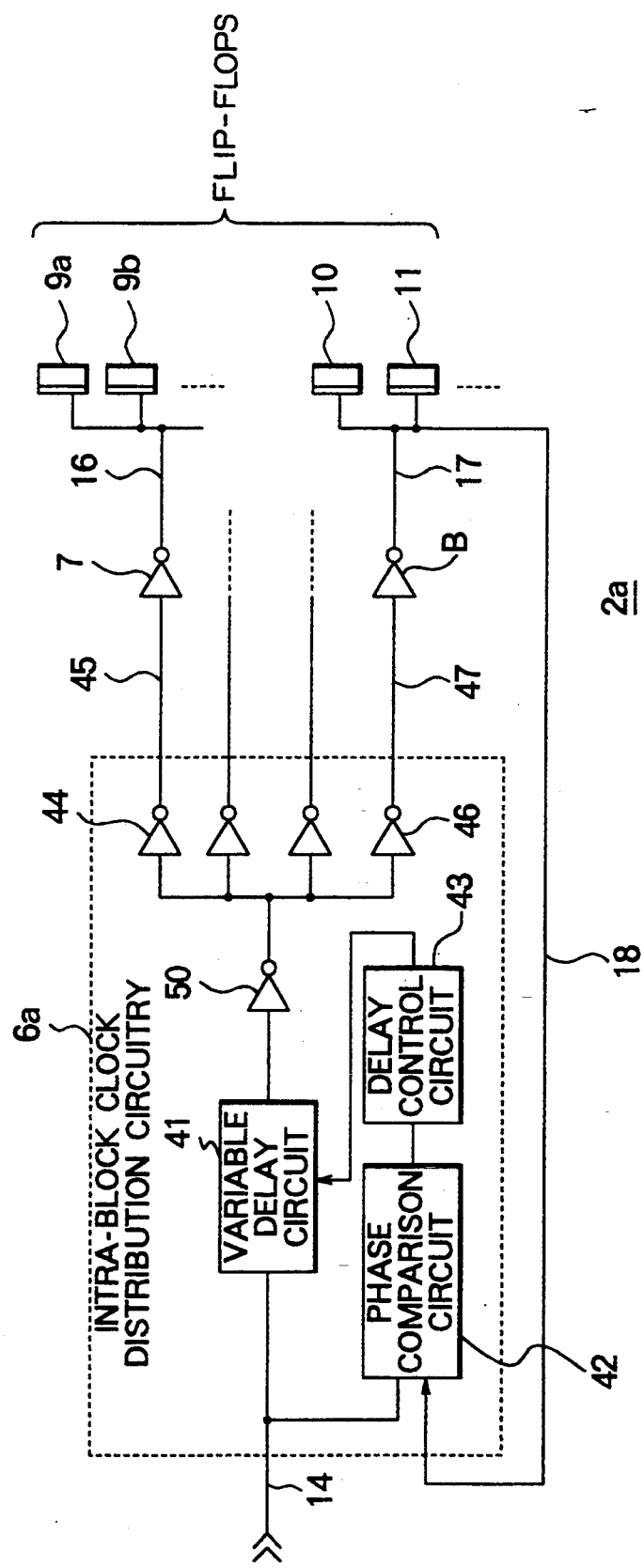
FIG. 3 is a circuit diagram showing a configuration of a clock signal distribution circuitry provided within a block shown in FIG. 1.

Next, referring to FIG. 3, description will be directed to a structure of the block by taking as example the block 2a. Needless to say, the clock signal must be supplied to all the flip-flops implemented within the block 2a from the intra-block distribution circuitry 6a. In this conjunction, there are provided several stages of drivers through which the clock signal is finally distributed to the flip-flops, as in the case of the device of the conventional design. In the case of the illustrated block 2a, there are provided drivers 7 and 8 in a first stage.

Usually, a greater number of the drivers are provided for one stage. Additionally, the number of the driver stages may be greater than two inclusive. By extending wires of a same length from the intra-block distribution circuitry 6a to the drivers 7 and 8, the delays which the clock signals undergo can be made equal to one another because the parasitic load capacitances such as wiring capacitances are then equalized. In case the drivers must drive succeeding stage drivers, the wiring between these driver stages must be dimensioned so as to equalize the delay times of the clock signals. In the case of the exemplary circuit configuration shown in FIG. 3, it is assumed for convenience of description that the drivers 7 and 8 directly drive the flip-flops 9a; 9b and the flip-flops 10; 11, respectively.

In this case, the load equalizing wiring method is adopted. Namely, the load capacitance of wiring for connecting the driver, e.g. driver 7 and the flip-flops 9a and 9b driven thereby is made equal to the load capacitance of the wiring for interconnecting the other driver and loads within the same block, e.g. the driver 8 and the flip-flops 10 and 11. To this end, the connections may be realized by using wires of a same width, same of a length and same material.

In the case of the instant embodiment of the invention, the blocks have respective sizes differing from one another. It is however assumed that the wiring for the clock signals within the blocks present equal load capacitance between or among the different blocks.

With the implementation described above, the phases of the clock signals distributed to the individual flip-flops within a single block can be matched with one another with high accuracy. However, among the different blocks, there arises possibility that the phase matching can not always be realized with satisfactory accuracy. By way of example, let's consider the blocks 2a and 2f which are greatly distanced from each other within the LSI chip. The intra-block distribution circuitries 6a and 6f as well as the drivers 7 and 8 within the blocks 2a and 2f may have variance in the characteristics. In that case, the delay times can not be equalized between the blocks 2a and 2f even when the wiring are designed on the basis of the load equalizing principle described previously.

In order to deal with the problem mentioned above, a feedback concept is adopted according to the invention. This will be described by taking as example the block 2a. An output wire 17 of the driver 8 is selected as the representative of the output wiring within the block 2a and wired back to the intra-block distribution circuitry 6 by way of a wire 18. Since the load capacitance of the wire 17 increases due to the provision of the wire 18, the latter should be so designed that the length thereof becomes as short as possible. As in the case of the conventional design, wire of low resistance is used for the wiring for the clock signal. Accordingly, it may be presumed that the time taken for transferring the clock signal via a same wire can be neglected, which in turn means that difference in phase between the clock signal at the flip-flop 11 and the clock signal delivered to the intra-block distribution circuitry 6a is negligible.

Figure 4:
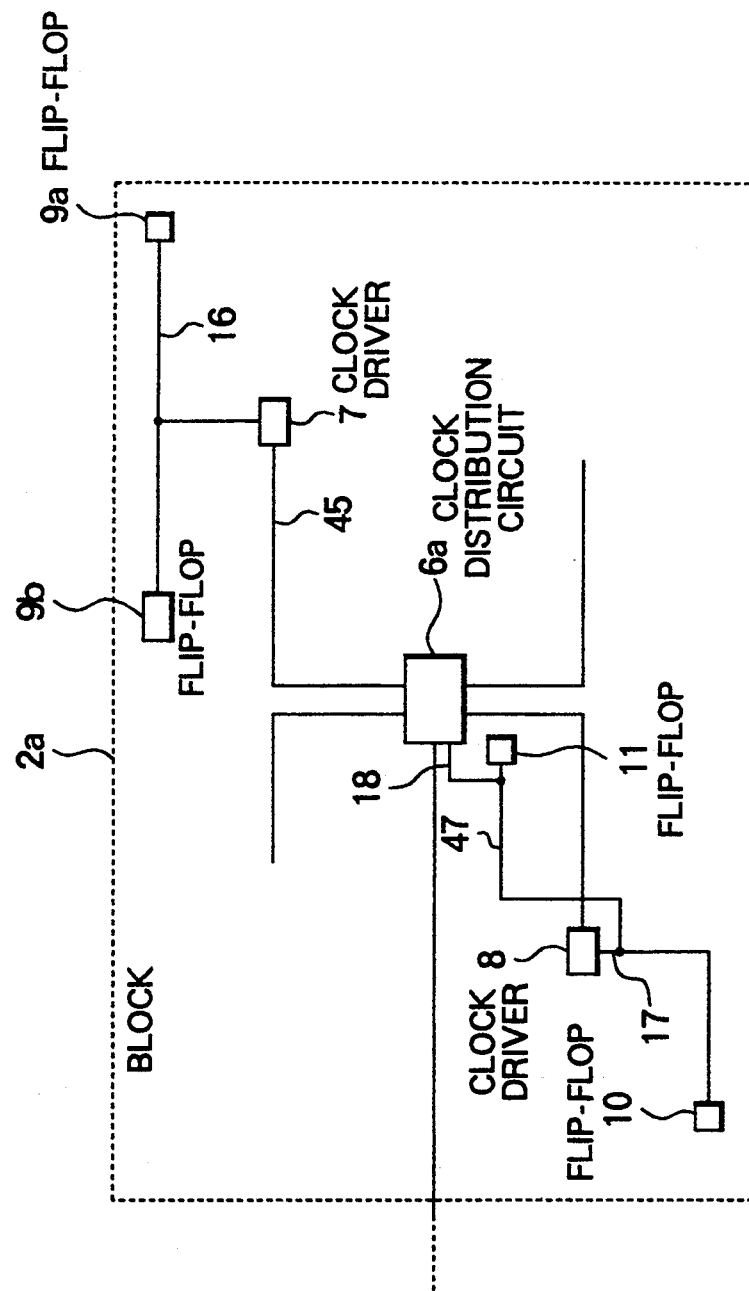
FIG. 4 is a diagram showing an exemplary layout of a block shown in FIG. 1.

FIG. 4 shows an exemplary layout of the block 2a.

As described hereinbefore, the circuit is so designed that the clock signal on the wire 16 is in phase with the signal on the wire 17. Thus, the wire 17 can reasonably be selected as the representative. The intra-block distribution circuitry receiving the feedback signal has a function for comparing the phase of the clock signal as fed back with that of the clock signal inputted thereto via the wire 14 to thereby change correspondingly the phase of the clock signal as outputted. Upon distribution of the clock signal via the wire 14, phase matching is effected at the input timing to the individual intra-block distribution circuitries. Accordingly, through the phase matching with the clock signal on the wire 14, it is possible to match the phases of clock signals at the time of inputting to the individual flip-flops of all the blocks with high accuracy.

FIG. 3 illustrates in detail a clock signal distribution effected by the intra-block distribution circuitry 6a within the block 2a. Referring to the figure, the intra-block distribution circuitry 6a is comprised of a variable delay circuit 41, a phase comparison circuit 42, a delay control circuit 43, and driver circuits 50 and 44, 46, etc. The clock signal sent from the inter-block distribution circuit 5 is inputted to the variable delay circuit 41 and the phase comparison circuit 42 of the intra-block distribution circuitry 6a. The phase comparison circuit 42 compares the phase of the clock signal with that of the signal fed back via the wire 18 from the output wire 17 of the driver 8 selected as the representative. The phase comparison circuit 42 may be constituted by a conventional one such as disclosed in JP-A-2-168303 or a corresponding U.S. Pat. No. 5,043,596 or a corresponding EPC Patent Application 89116782 (filed Sep. 11, 1989).

The result of phase comparison, i.e., the information concerning which of the signals undergone the comparison advances in phase, is fed to the delay control circuit 43 which then controls the variable delay circuit 41 on the basis of the information to thereby change the delay time of the clock signal. In this manner, adjustment of the delay time is carried out such that the phase of the clock signal as fed back matches with that of the clock signal supplied from the inter-block distribution circuit 5.

It is known to impart a variable delay time to the clock signal in each of the LSIs in order to realize the phase match of the clock distribution to a plurality of LSIs, as is disclosed in the literature mentioned above. The clock distribution circuit which is capable of changing the phases of clocks and which has heretofore been used for reducing skew of the clock signals among the LSIs may also be used as the intra-block distribution circuitry in the case of the instant embodiment. Besides, the delay control circuit 43 and the variable delay circuit 41 used for adjustment of the delay time may be realized by resorting to known techniques such as those disclosed in JP-A-2-168303, FIGS. 4 and 5 (or corresponding U.S. Pat. No. 5,043,596 or EPC Appln. 89116782 filed Sep. 11, 1989).

As is apparent from the foregoing, according to the teachings of the invention incarnated in the instant embodiment, it is possible to adjust the phases of the clock signals distributed to the clocks of individual blocks so that the phase of the clock signal matches with that of the clock signal supplied from the inter-block distribution circuit even when the phase of the clock signal supplied to the flip-flop incorporated in the block differs from one to another block due to the fact that the driving capability of the driver incorporated in or connected to the intra-block distribution circuitries differs from one to another block.

Thus, variance in the phase of the intra-block clock signals brought about by variance in the driving capability depending on the location of the block in the LSI as manufactured or variance of electrostatic coupling between the clock signal wire and other wire within the block in dependence on the locations in the LSI can be compensated for.

Embodiment 2

In the case of the first embodiment of the invention, the lengths of the clock signal wires within a block are made equal to one another regardless of difference in the block size.

By way of example, let's assume that in the arrangement shown in FIG. 1, the block 2a has a greater size than the block 2e and contains a larger number of flip-flops than the latter. According to the invention incarnated in the first embodiment, not only the lengths of plural clock wires within the block 2a but also those within other blocks are made equal to one another nevertheless of difference in the block size mentioned above.

However, it is preferred from the standpoint of design to allow the wire length to differ on a block-by-block basis in dependence on the block size. In the case of the example mentioned above, it is desirable from the standpoint of design to allow the length of the clock wires within the block 2e to be shorter than that of the clock wires within the block 2a.

With the second embodiment of the invention, it is contemplated to allow the wire length to differ from one to another block.

According to the second embodiment, there are employed the inter-block distribution circuit and a plurality of intra-block distribution circuitries connected to the inter-block distribution circuit by wires of a same length, wherein in each of the individual blocks, the load capacities of plural clock wires or the lengths thereof, to say in more concrete, are equalized to one another, as shown in FIG. 1. Further, the signal lines 18 are provided for feeding back the clock signal to the intra-block distribution circuitry from the clock wires within each block, as with the case of the arrangement shown in FIG. 1. However, differing from the configuration shown in FIG. 1, the length of the clock signal wires within each block is allowed to differ from one to another block. With regards to the other respects, the second embodiment is same as or equivalent to the first embodiment.

As is apparent from the description directed to the operation of the circuit according to the first embodiment, it is possible to match the phase of the clock supplied to the flip-flops within each block with the phase of the clock signal supplied from the inter-block distribution circuit even when the clock wire length differs from one to another block.

Thus, the second embodiment of the invention can provide advantage that the inter-block clock skew can be reduced notwithstanding of difference in the clock wire length on the block-by-block basis in addition to the advantages mentioned hereinbefore in conjunction with the first embodiment.

In the case of the instant embodiment, it is necessary to design each of the intra-block distribution circuitries 6a and others such that a delay time required for canceling difference between the delay time due to the maximum clock wire in a given one of the block in the LSI and the delay times due to the clock wires within that one block is imparted to the clock signal inputted to the relevant intra-block distribution circuitry. Accordingly, in the instant embodiment, it is necessary to employ the intra-block distribution circuit which can impart a longer delay time as compared with that employed in the first embodiment.

Thus, it is desirable to provide at the entrance of the variable delay circuit of each block a fixed delay circuit described below in place of the variable delay circuit described above. More specifically, such a fixed delay circuit is used which can ensure a delay time corresponding to difference between the delay time involved due to the clock wire in the block and the aforementioned maximum delay time. In this case, the variable delay circuit of the intra-block distribution circuit may be constituted by a delay circuit which can delay the clock signal over a block-independent variable time period.

Embodiment 3

Figure 5:
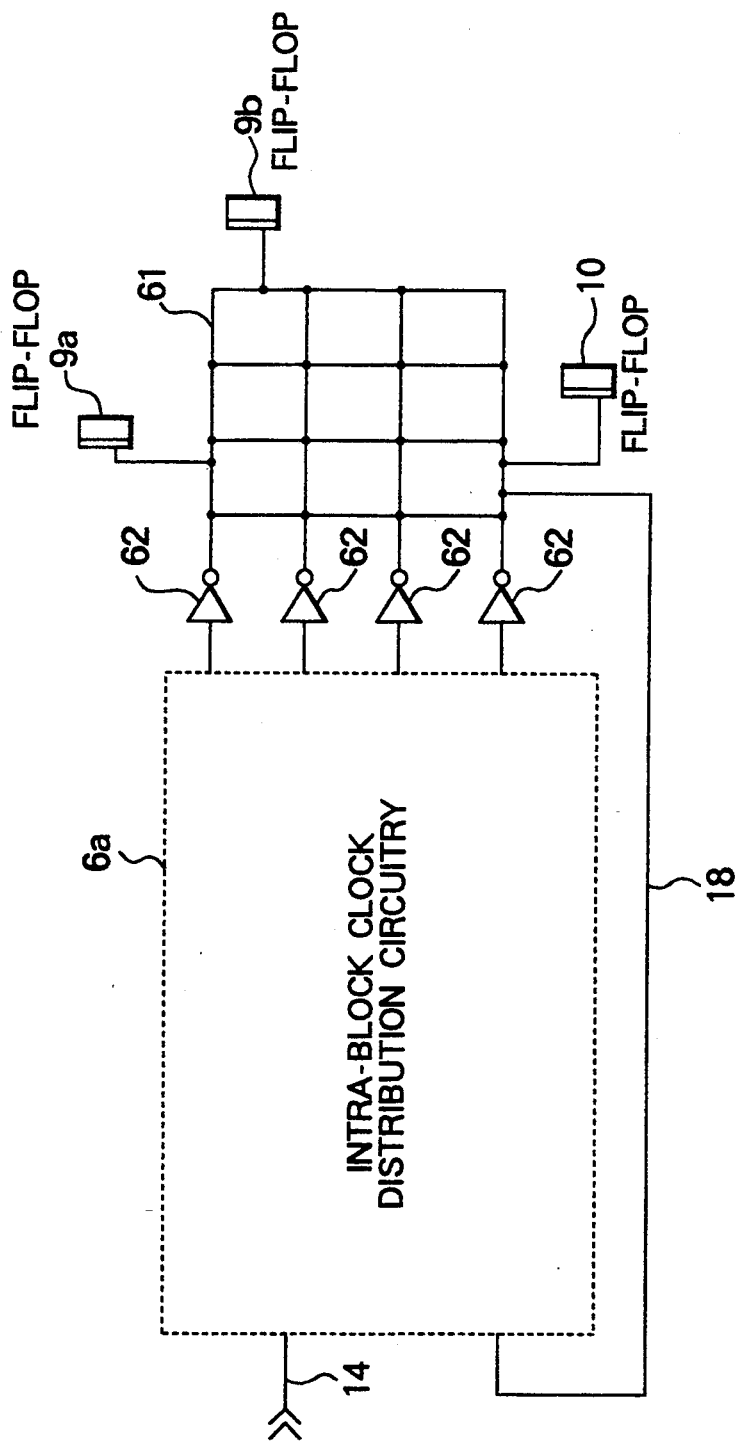
FIG. 5 is a diagram showing an intra-block clock distribution circuit in an LSI chip according to another embodiment of the invention.
Figure 6:
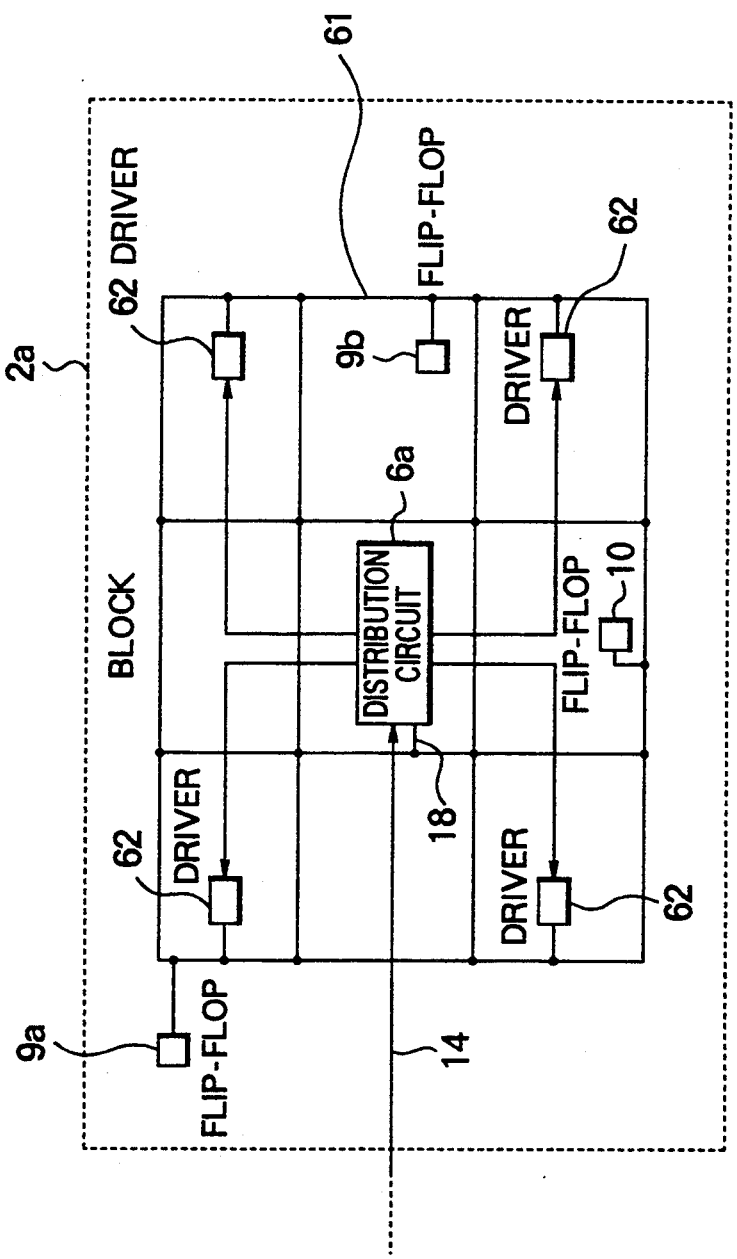
FIG. 6 is a diagram showing an exemplary layout of the block shown in FIG. 5.

FIG. 5 shows another embodiment of the invention for realizing the clock distribution scheme within the block 2a, and FIG. 6 shows an exemplary layout for the circuit arrangement shown in FIG. 5.

Difference of the arrangement illustrated in FIGS. 5 and 6 from that of FIG. 3 is seen in that wires 61 extending from the intra-block distribution circuitry 6a to the flip-flops 9a, 9b, 10 and others are used together with the plurality of drivers 62 for driving the wires 61, wherein the clock signal is distributed to a clock of the intra-block distribution circuitry 6a via a wire 18 from an appropriate circuit point in a mesh-like wire connection 61. Parenthetically, use of the mesh-like wire connection is known in the art, as disclosed in the literatures mentioned hereinbefore. It should however be noted that in contrast to the known device in which only one mesh-like wire connection is provided for the whole chip, as described in the literatures mentioned above, the mesh-like wire 61 is used in each of the blocks according to the instant embodiment of the invention, wherein the mesh-like wires in the different blocks are not mutually connected.

From the standpoint of LSI design, the use of the mesh-like wire 61 provides an advantage that the flip-flops 9a and other may be connected to the mesh-like wire 61 at given or appropriate positions thereof.

The load capacitances of the mesh-like wires 61 of the individual blocks are designed to be same among the blocks. As a result of this, it is possible to match the clock transfer times via the mesh-like wires of the individual blocks.

Further, variance in the driving capability among the drivers 62 or the intra-block distribution circuitry 6a in dependence on the locations of them in the LSI can be adjusted or canceled out by adopting the feedback compensation technique described hereinbefore in conjunction with the first embodiment.

When compared with the hitherto known device in which the mesh-like wire is provided for the whole LSI, the overall length of the mesh-like wires in the whole LSI chip in the case where the mesh-like wire is provided on a block-by-block basis can significantly be decreased. Thus, power consumption ascribable to the wiring can be reduced when compared with the prior art device.

Embodiment 4

In the case of the third embodiment of the invention, the overall length of the mesh-like wire provided blockwise is designed to be same regardless of difference in the block size. However, there may arise such situation in which the overall length of the mesh-like wire should preferably be determined on a block-by-block basis for the same reasons as described hereinbefore in conjunction with the second embodiment.

Thus, according to the fourth embodiment of the invention, it is taught to allow the overall length of the mesh-like wire 61 to differ from one to another block. In other respects, the instant embodiment is the same as the third embodiment.

As can be appreciated from the description of the second and third embodiments, the clock skew among the blocks can be mitigated.

Thus, the instant embodiment provides an advantage in addition to those of the third embodiment that the clock skew can be reduced even when the overall length of the mesh-like clock wire is made different from one to another block.

Although the invention has been described in conjunction with the typical or preferred embodiments, it should be understood that numerous versions or modifications are possible without departing from the spirit and scope of the invention, some of which will be mentioned below.

Figure 7:
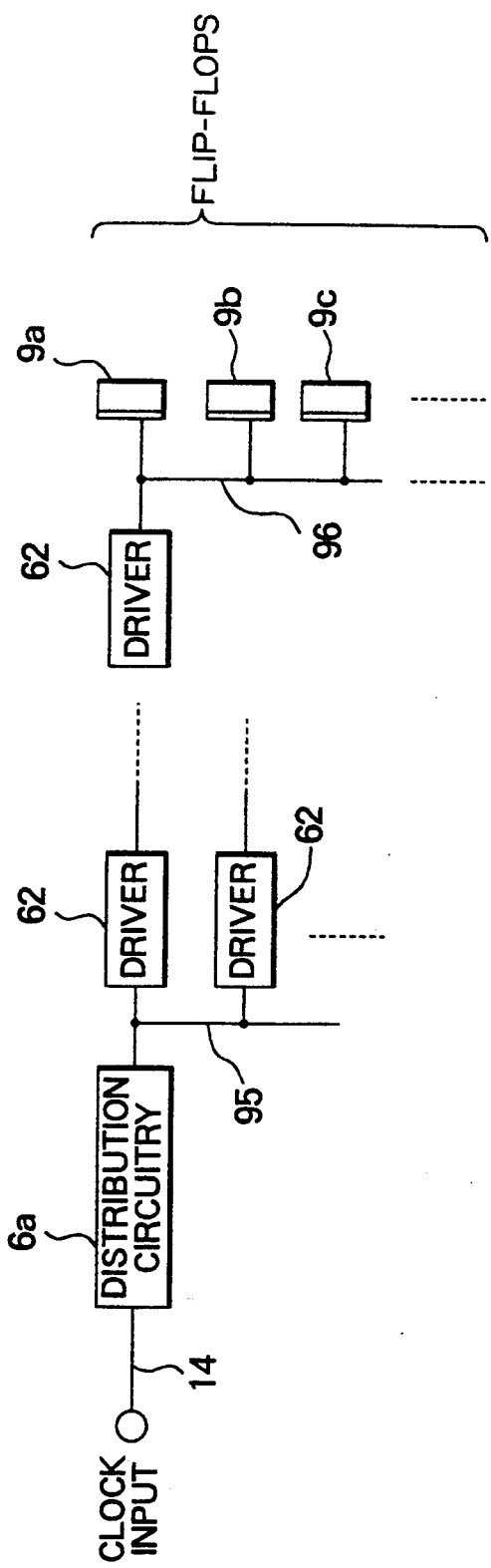
FIG. 7 is a diagram showing drivers connected in multiple stages which can be employed in carrying out the invention.

Modifications (1) As is shown in FIG. 7, drivers 62 connected in a multi-stage tree-like configuration which is known per se may be employed in the device according to the first or second embodiment. The multi-stage treelike connection of the drivers 62 is effective when a large number of flip-flops 9a, 9b, 9c, etc. are employed or when they are to be driven at higher speed by the clock signal. In this case, the load capacitances of the wires extending from each driver 62 to the drivers of a succeeding stage should preferably be same for the drivers of one and the same stage.

Figure 8:
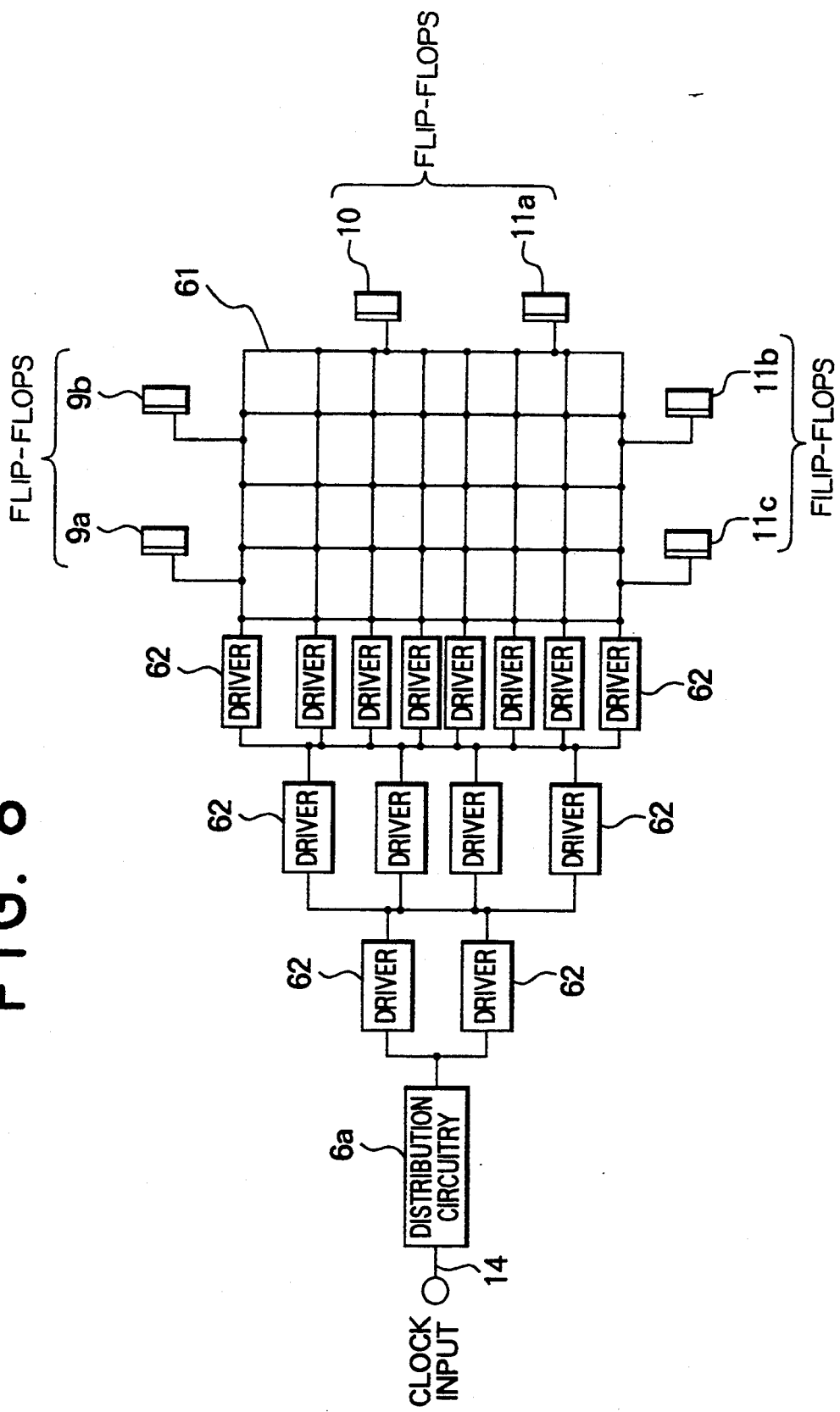
FIG. 8 is a diagram showing drivers connected in multiple stage which can equally be employed carrying out the invention.

(2) FIG. 8 shows a modification of the third or fourth embodiment in which multiple stages of drivers 62 known per se are provided between the mesh-like wire 61 and the intra-block distribution circuitry 6a. In this case, outputs of the drivers belonging to a same stage are mutually connected, differing from the arrangement shown in FIG. 7.

(3) It is equally possible to adjust the phase of clock output by using a VCO (Voltage Controlled Oscillator) in place of the variable delay circuit of the intra-block distribution circuitry, as is suggested in the literature mentioned hereinbefore.

As will now be understood from the foregoing description, it is possible according to a first aspect of the invention to make available the clock signal of the least skew even in an LSI of very high integration density or an LSI exhibiting significant variances in the characteristics.

Additionally, according to a second aspect of the invention, the clock signals for which skew is significantly reduced can be utilized in the whole LSI while allowing the lengths of the clock signal wires within the LSI to be variable in dependence on the positions of the clock signal wires in the LSI.

Besides, according to a third aspect of the invention, it is possible to supply the clock signal suffering less skew with a lower power consumption through relatively simple control of the wire length in the block when compared with the case where the net-like clock signal wiring is employed for the whole chip.

What is claimed is:

1. A clock distribution circuit provided in an LSi chip for supplying an external clock signal supplied from outside of said LSI chip to a plurality of circuit elements provided in said LSI chip, comprising:

a main distribution circuit for generating from said external clock signal a plurality of block-destined clock signals which are substantially in phase with one another and which are to be distributed, respectively, to associated ones of plural blocks within said LSI chip;

a plurality of block-based clock signal wires connected to said main distribution circuit for distributing said plurality of block-destined clock signals generated by said main distribution circuit to different ones of said plural blocks, respectively, while maintaining a substantially same phase among said distributed block-destined clock signals;

a plurality of intra-block clock distribution circuitries each provided in one of said blocks and each connected to associated one of said plurality of block-based clock signal wires, each of said intra-block clock distribution circuitries generating, from one of said block-destined clock signals which is transferred via associated one of said block-based clock signal wires, a plurality of intra-block clock signals which are substantially in phase with one another and which are to be distributed to a plurality of circuit elements provided in an associated one of said blocks to which said each intra-block clock distribution circuitry belongs;

a plurality of intra-block clock signal wires provided in association with one of said blocks and connected to the intra-block distribution circuitry provided in the associated block and to a plurality of circuit elements provided in said associated block, for thereby distributing a plurality of intra-block clock signals generated by said intra-block clock distribution circuitry to said plurality of circuit elements, while maintaining a substantially same phase among said plurality of distributed intra-block clock signals; and a feedback wire provided in association with each block, the feedback wire being connected to one of said plurality of intra-block clock signal wires provided in said block and said intra-block distribution circuitry provided in said block, the feedback wire feeding back an intra-block clock signal distributed to one circuit element connected to said one intra-block clock signal wire provided in said block to said intra-block clock distribution circuitry provided in said associated block;

wherein said intra-block clock distribution circuitry provided in each block includes:

means responsive to one of said plurality of block-destined clock signals supplied to said block via one of said block-based clock signal wires connected to said block and responsive to the intra-block clock signal fed back via said feedback wire provided in said block for generating a plurality of intra-block clock signals having a substantially same phases which depends on a difference in phase between said block-destined clock signal and said fed-back intra-block clock signal.

2. A clock distribution circuit according to claim 1, wherein said intra-block clock distribution circuitry provided in each block, includes:

a variable delay circuit for delaying with a variable delay time one of the block-destined clock signals distributed from said main distribution circuit to said block;

a phase comparison circuit for comparing a phase of one of the block-destined clock signals supplied to the block with a phase of an intra-block clock signal fed back via said feedback wire provided in the block;

a circuit responsive to output of said phase comparison circuit for thereby controlling the delay time to be imparted by said variable delay circuit; and a circuit for generating a plurality of intra-block clock signals from the delayed block-destined clock signal outputted from said variable delay circuit.

3. A clock distribution circuit according to claim 1, wherein each of said intra-block clock signal wires provided in each block is connected to selected part of said plurality of circuit elements provided with said block, wherein one of said feedback wire provided in said block is selectively connected to one of said plural intra-block clock signal wires provided in said block.

4. A clock distribution circuit according to claim 3, wherein said plural intra-block clock signal wires provided in each block has a substantially same length with each other.

5. A clock distribution circuit according to claim 3, wherein a sum of length of said feedback wire provided in each block and one of said intra-block clock signal wires provided in said block connected to said feedback wire is substantially same as that of any other one of said plural intra-block clock signal wires provided in said block.

6. A clock distribution circuit according to claim 4, wherein said plurality of intra-block signal wires in each block has a substantially same length as those in other blocks.

7. A clock distribution circuit according to claim 5, wherein (1) a sum of length of one of said plurality of intra-block clock signal wires within said block, connected to said feedback wire and length of said feedback wire, and (2) length of each of said plurality intra-block clock signal wires in said block other than said one intra-block clock signal wire are substantially same as (3) a sum of length of said feedback wire in each of other blocks and length of one of said plurality of intra-block clock signal wires within said each of other blocks connected to the feedback wire therewith and (4) length of each of plurality of intra-block clock signal wires other than said one intra-block clock signal wire in said each of other blocks, respectively.

8. A clock distribution circuit according to claim 3, wherein each block further includes a plurality of driver circuits connected in a multiplicity of stages for driving the plurality of intra-block clock signal wires within said each block, in response to the clock signals distributed from said intra-block distribution circuitry of said each block.

9. A clock distribution circuit according to claim 4, wherein each block further includes a plurality of driver circuits connected in a multiplicity of stages for driving the plurality of intra-block clock signal wires within said each block, in response to the clock signals distributed from said intra-block distribution circuitry of said each block.

10. A clock distribution circuit according to claim 5, wherein each block further includes a plurality of driver circuits connected in a multiplicity of stages for driving the plurality of intra-block clock signal wires within said each block, in response to the clock signals distributed from said intra-block distribution circuitry of said each block.

11. A clock distribution circuit provided in an LSI chip for supplying an external clock signal supplied from outside of said LSI chip to a plurality of circuit elements within said LSI chip, comprising:

a main distribution circuit for generating, from said external clock signal, a plurality of block-destined clock signals which are substantially in phase with one another and which are to be distributed to associated ones of plural blocks within said LSI chip;

a plurality of block-based clock signal wires connected to said main distribution circuit for distributing said plurality of block-destined clock signals generated by said main distribution circuit to different ones of said plural blocks, respectively, while maintaining a substantially same phase among said distributed block-destined clock signals;

a plurality of intra-block clock distribution circuitries each provided in one of said blocks and each connected to associated one of said plurality of block-based clock signal wires, each of said intra-block clock distribution circuitries generating, from one of said block-destined clock signals which is transferred via said associated one of said block-based clock signal wires, a plurality of intra-block clock signals which are substantially in phase with one another and which are to be distributed to a plurality of circuit elements provided in an associated one of said blocks to which said each intra-block clock distribution circuitry belongs;

a plurality of intra-block clock signal wires provided in association with each of said blocks and connected to the intra-block distribution circuitry provided in said block and to a plurality of circuit elements provided in said block, for thereby distributing said plurality of intra-block clock signals generated by said intra-block clock distribution circuitry to said plurality of circuit elements while maintaining a substantially same phase among said plurality of distributed intra-block clock signals;

phases of said plurality of intra-block clock signals supplied to a plurality of circuit elements in each block via the plurality of intra-block clock signal wires in said each block differing substantially from phases of said plurality of intra-block clock signals supplied to a plurality of circuit elements in at least one of other blocks via said plurality of intra-block signal wires within said at least one other block; and each block further including a feedback wire connected to one of said plural block-based clock signal wires in said block and said intra-block clock distribution circuitry of said block for feeding back one of said plurality of intra-block clock signals distributed to one of circuit elements connected to said intra-block clock signal wire in said block to said intra-block clock distribution circuitry of said block;

wherein said intra-block clock distribution circuitry in each blocks includes:

means responsive to one of said block-destined clock signal supplied to said block via one of said block-based clock signal wires connected to said block and responsive to the intra-block clock signals fed back via said feedback wire in said block for generating a plurality of intra-block clock signals having a substantially same phases which depends on difference in phase between said block-destined clock signal and said feedback intra-block clock signal.

12. A clock distribution circuit according to claim 11, wherein said intra-block clock distribution circuitry provided in each block, includes:

a variable delay circuit for delaying with a variable delay time one of the block-destined clock signals distributed from said main distribution circuit;

a phase comparison circuit for comparing a phase of one of the block-destined clock signals supplied to the block with a phase of an intra-block clock signal fed back via said feedback wire in the block;

a circuit responsive to output of said phase comparison circuit for thereby controlling the delay time to be imparted by said variable delay circuit; and a circuit for generating a plurality of intra-block clock signals from the delayed block-destined clock signal outputted from said variable delay circuit.

13. A clock distribution circuit according to claim 11, wherein each of said intra-block clock signal wires in each block is connected to selected part of said plurality of circuit elements provided within said block, wherein one of said feedback wire provided in said block is selectively connected to one of said plural intra-block clock signal wires provided in said block.

14. A clock distribution circuit according to claim 13, wherein said plural intra-block clock signal wires in each block has a substantially same length with each other, and wherein length of the plurality of intra-block clock signal wires in at least one of said plural blocks differs substantially from that of the plurality of intra-block clock signal wires provided in another of the said blocks.

15. A clock distribution circuit according to claim 13, wherein (1) a sum of length of said feedback wire of length of one of said one intra-block clock signal wires within each block connected to said feedback wire therewith and of (2) length of each of said plurality of intra-block clock signal wires with said block other than said one intra-block clock signal wire in said block are substantially same wherein the sum of the length of said feedback wire and the length of said one intra-block clock signal wire connected to said feedback wire is substantially different from a corresponding sum of length of the feedback wire within at least one other block and length of one of the intra-block clock signal wires therewithin connected to the feedback wire therewithin.

16. A clock distribution circuit according to claim 14, wherein the intra-block distribution circuitry of each block includes;

a fixed delay circuit provided between one of the block-based clock signal wires connected to said each block and the variable delay circuit of the intra-block distribution circuitry in said each block, for imparting to one of the block-destined clock signals distributed from said main distribution circuit to said each block, a fixed delay time corresponding to difference between length of each intra-block clock signal wire in said block and a minimum one of lengths of plural intra-block clock signal wires in the plural blocks.

17. A clock distribution circuit according to claim 15, wherein the intra-block distribution circuitry of each block includes;

a fixed delay circuit provided between one of the block-based clock signal wires connected to said each block and the variable delay circuit of the intra-block distribution circuitry in said each block, for imparting to one of the block-destined clock signals distributed from said main distribution circuit to said each block, a fixed delay time corresponding to difference between length of each intra-block clock signal wire in said block and a minimum one of lengths of plural intra-block clock signal wires in the plural blocks.

18. A clock distribution circuit according to claim 14, wherein each block further includes a plurality of driver circuits arrayed in a tree-like configuration for driving the plurality of intra-block clock signal wires within said each block, in response to the clock signal distributed from said intra-block distribution circuitry of said each block.

19. A clock distribution circuit according to claim 15, wherein each block further includes a plurality of driver circuits arrayed in a tree-like configuration for driving the plurality of intra-block clock signal wires within said each block, in response to the clock signal distributed from said intra-block distribution circuitry of said each block.

20. A clock distribution circuit provided in an LSI chip for supplying an external clock signal supplied from outside of said LSI chip to a plurality of circuit elements incorporated in said LSI chip, comprising:

a main distribution circuit for generating from said external clock signal a plurality of block-destined clock signals which are substantially in phase with one another and which are to be distributed, respectively, to associated ones of plural blocks within said LSI chip;

a plurality of block-based clock signal wires connected to said main distribution circuit for distributing said plurality of block-destined clock signals generated by said main distribution circuit to different ones of said plural blocks, respectively, while maintaining a substantially same phase among said distributed block-destined clock signals;

a plurality of intra-block clock distribution circuitries each provided in one of said blocks and each connected to associated one of said plurality of block-based clock signal wires, each of said intra-block clock distribution circuitries generating, from one of said block-destined clock signals which is transferred via said associated block-based clock signal wire, a plurality of intra-block clock signals which are substantially in phase with one another and which are to be distributed to a plurality of circuit elements provided in an associated block to which said each intra-block clock distribution circuitry belongs;

a plurality of intra-block clock signal wires provided in association with each of said blocks and connected to the intra-block distribution circuitry provided in said block and to a plurality of circuit elements provided in said block, for distributing said plurality of intra-block clock signals generated by said intra-block clock distribution circuitries to said plurality of circuit elements, while maintaining a substantially same phase among said plurality of distributed intra-block clock signals;

said plurality of intra-block clock signal wires in each block being so interconnected as to form a net-like wiring;

said plurality of circuit elements in each block being connected to the net-like wiring formed in said each block;

a plurality of feedback wires each provided in association with one of said blocks and each connected to said net-like wiring formed in said associated block and said intra-block clock distribution circuitry of said associated block for feeding back one of said plurality of intra-block clock signals distributed to one of said circuit elements connected to said one intra-block clock signal wire to said intra-block clock distribution circuitry of said block;

wherein said intra-block clock distribution circuitry in each block includes:

means responsive to one of said block-destined clock signals supplied to said block via one of said block-based clock signal wires connected to said block and responsive to the intra-block clock signals fed back via said feedback wire in said block for generating a plurality of intra-block clock signals having a substantially same phase which depends on difference in phase between said one block-destined clock signal and said fed-back intra-block clock signal.

21. A clock distribution circuit according to claim 20, wherein said intra-block clock distribution circuitry provided in each block includes:

a variable delay circuit for delaying with a variable delay time one of the block-destined clock signals distributed from said main distribution circuit to the block;

a phase comparison circuit for comparing a phase of one of the block-destined clock signal supplied to the block with a phase of one of the intra-block clock signals fed back via said feedback wire in the block;

a circuit responsive to output of said phase comparison circuit for thereby controlling the delay time to be imparted by said variable delay circuit; and a circuit for generating a plurality of intra-block clock signals from the delayed block-destined clock signal outputted from said variable delay circuit.

22. A clock distribution circuit according to claim 20, wherein overall length of said net-like wiring in each block is substantially equal to the overall length of the net-like wiring in any other block.

23. A clock distribution circuit according to claim 20, wherein overall length of the net-like wiring in at least one of said plural blocks differs from overall length of the net-like wiring provided in any other one of said blocks.

24. A clock distribution circuit according to claim 20, each block including a plurality of driver circuits arrayed in a plurality of stages for driving said plurality of circuit elements connected to the net-like wiring within the block, in response to one of the clock signals distributed from said intra-block clock distribution circuitry of said each block, wherein output terminals of a plurality of driver circuits belonging to a same stage are connected to one another.

25. A clock distribution circuit according to claim 22, each of said block further including a plurality of driver circuits arrayed in a plurality of stages for driving said plurality of circuit elements connected to the net-like wiring within said each block, in response to a clock signal distributed from said intra-block clock distribution circuitry of said each block, wherein output terminals of a plurality of driver circuits belonging to a same stage are connected to one another.

26. A clock distribution circuit according to claim 23, each block further including a plurality of driver circuits arrayed in a plurality of stages for driving said plurality of circuit elements connected to the net-like wiring, in response to a clock signal distributed from said intra-block clock distribution circuitry of said each block, wherein output terminals of a plurality of driver circuits belonging to a same stage are connected to one another.

* * * * *